(12) United States Patent
Cernea

(10) Patent No.: US 9,373,408 B2
(45) Date of Patent: Jun. 21, 2016

(54) HIGHLY LINEAR ANALOG-TO-DIGITAL CONVERTER AND METHOD FOR NONVOLATILE MEMORY

(71) Applicant: SANDISK TECHNOLOGIES, INC., Plano, TX (US)

(72) Inventor: Raul Adrian Cernea, Santa Clara, CA (US)

(73) Assignee: SanDisk Technologies, Inc., Plano, TX (US)

( * ) Notice: Subject to any disclaimer, the term of this patent is extended or adjusted under 35 U.S.C. 154(b) by 29 days.

(21) Appl. No.: 14/508,274

(22) Filed: Oct. 7, 2014

(65) Prior Publication Data

US 2016/0099073 A1 Apr. 7, 2016

(51) Int. Cl.
*H03M 1/56* (2006.01)
*G11C 16/32* (2006.01)
*G11C 16/10* (2006.01)
*G11C 16/34* (2006.01)
*G11C 16/28* (2006.01)
*G11C 7/18* (2006.01)
*G11C 11/56* (2006.01)

(52) U.S. Cl.
CPC ........ *G11C 16/32* (2013.01); *G11C 7/18* (2013.01); *G11C 11/5628* (2013.01); *G11C 16/10* (2013.01); *G11C 16/28* (2013.01); *G11C 16/3454* (2013.01); *H03M 1/56* (2013.01)

(58) Field of Classification Search
CPC ..... H03M 1/56; G11C 16/10; G11C 16/3454; G11C 16/28; G11C 11/5628; G11C 7/18
USPC .......... 341/169; 365/185.19, 185.22, 185.21, 365/185.24, 185.03, 185.13
See application file for complete search history.

(56) References Cited

U.S. PATENT DOCUMENTS

| 8,334,796 | B2 | 12/2012 | Wani et al. |
| 2004/0062085 | A1 | 4/2004 | Wang et al. |
| 2008/0031066 | A1 | 2/2008 | Nandi |
| 2008/0159000 | A1 | 7/2008 | Li et al. |
| 2010/0039863 | A1* | 2/2010 | Sarin ........... G11C 11/5628 365/185.19 |

OTHER PUBLICATIONS

Marotta et al. "A 3bit/Cell 32Gb NAND Flash Memory at 34nm with 6MB/s Program Throughput and with Dynamic 2b/Cell Blocks Configuration Mode for a Program Throughput increase up to 13MB/s", ISSCC 2010 Conference, Session 24, DRAM and Flash Memories, 24.7, Digest of Technical Papers, dated Feb. 10, 2010, pp. 444-445.

* cited by examiner

*Primary Examiner* — Joseph Lauture
(74) *Attorney, Agent, or Firm* — Sterne, Kessler, Goldstein & Fox PLLC

(57) ABSTRACT

A non-volatile memory has an ADC that digitizes an analog voltage in a range delimited by V1 and V2 into N intervals, resulting in a digital Vx with x between 1 to N. A ramp voltage Vramp(x) calibrated to rise linearly from V1 to V2 in x=1 to N clock cycles is used to scan the analog voltage. Vx is then given by Vx=Vramp(x). The ramp voltage is provided by a constant current charging a capacitor and has a slope proportional to a DAC resistor, R(x) that is programmable from 1 to N. In a calibration mode, the R(x) is set to N, which results in K clock cycles spanning V1 to V2. In a subsequent normal mode, the DAC resistor is reset to R(K) to result in a calibrated ramp voltage that would rise from V1 to V2 in N clock cycles.

17 Claims, 14 Drawing Sheets

Programmable Ramp Generator *330*

Ideal ADC

Nonlinear ADC

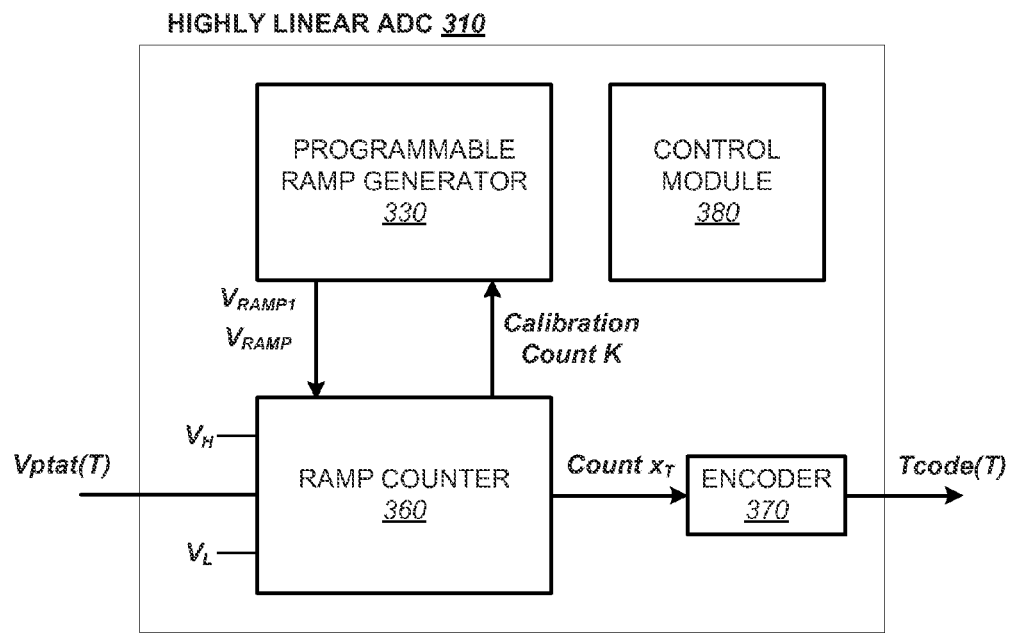
FIG. 14
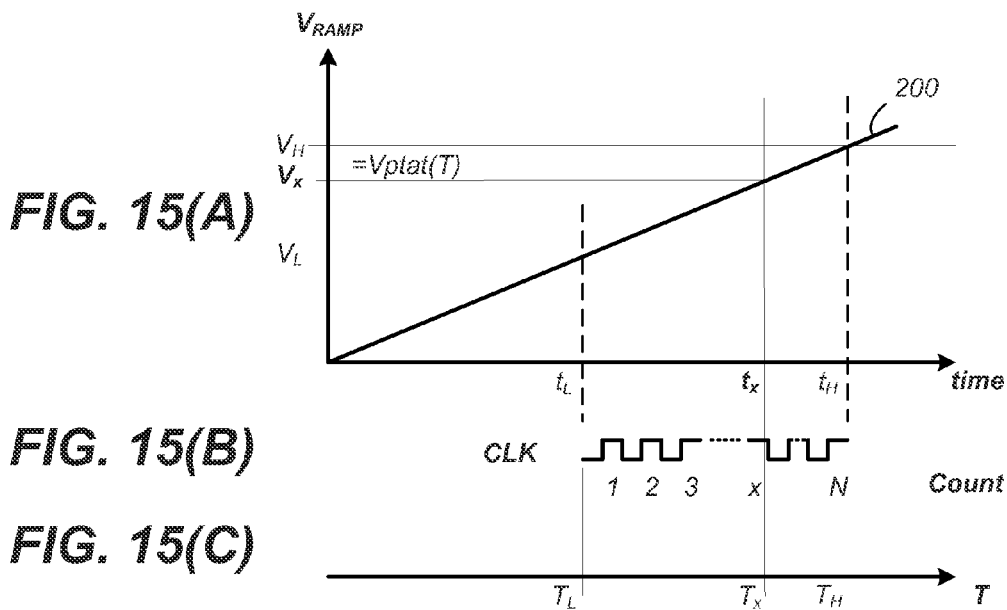
FIG. 15(A)
FIG. 15(B)
FIG. 15(C)

HIGHLY LINEAR ANALOG-TO-DIGITAL CONVERTER AND METHOD FOR NONVOLATILE MEMORY

BACKGROUND

This application relates generally to techniques in voltage manipulation in semiconductor devices such as two- or three-dimensional non-volatile semiconductor memory, and more particularly to an analog-to-digital converter (ADC) and a method for digitizing voltages used in the memory.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page are read or programmed together.

Nonvolatile memory devices are also manufactured from memory cells with a dielectric layer for storing charge. Instead of the conductive floating gate elements described earlier, a dielectric layer is used. An ONO dielectric layer extends across the channel between source and drain diffusions. The charge for one data bit is localized in the dielectric layer adjacent to the drain, and the charge for the other data bit is localized in the dielectric layer adjacent to the source. For example, a nonvolatile memory cell may have a trapping dielectric sandwiched between two silicon dioxide layers. Multi-state data storage is implemented by separately reading the binary states of the spatially separated charge storage regions within the dielectric.

In order to provide the voltages for memory operations such as the programming and verify operations, as well as any read operations, a voltage generator capable of generating the various DC voltage levels on demand is required. Furthermore, the operations mostly depend on the thresholds of the FET and EEPROM devices making up the circuits and the memory cells. The thresholds of these FET and EEPROM devices changes with temperature. In order to maintain regularity in operation, a common type of these devices need to be supplied with an operating voltage that has a negative temperature coefficient.

United States Patent Publication No. 2004/0062085 A1 discloses an on-chip voltage generator having such capabilities. The voltage generator is implemented with analog circuitry, which occupies substantial space on the chip.

United States Patent Publication No. 2008/0031066 A1 and United States Patent Publication No. 2008/0159000 A1 both disclose on-chip voltage generators that are also analog.

"A 3 bit/Cell 32 Gb NAND Flash Memory at 34 nm with 6 MB/s Program Throughput and with Dynamic 2b/Cell Blocks Configuration Mode for a Program Throughput increase up to 13 MB/s", ISSCC 2010 Conference, Session 24, DRAM and FLASH MEMORIES, 24.7, Digest of Technical Papers, pp. 444-445, discloses a voltage generator with a digital component where the computation involves looking up values from various stored tables.

Existing voltage generators involve the use of digital to analog converters and associated circuitry to add and subtract voltages with and without temperature coefficients to generate final voltages with negative temperature coefficients. These implementations tend to be expensive, complex, resource intensive and bulky.

U.S. Pat. No. 8,334,796 discloses an on-chip DC voltage generator for generating linear DC voltages with a programmable negative temperature coefficient. The ADC used is a standard flash ADC. However, in practice the flash ADC is non-linear due to non-uniformity of the individual comparators in the ADC.

Therefore there is a general need for an on-chip voltage generator which is compact and inexpensive to implement and flexible in terms of programmability. In particular, a need for an on-chip voltage generator that has a highly linear ADC.

SUMMARY

A non-volatile memory has an ADC that digitizes an analog voltage in a range delimited by V1 and V2 into N intervals, resulting in a digital Vx with x between 1 to N. A ramp voltage Vramp(x) calibrated to rise linearly from V1 to V2 in x=1 to N clock cycles is used to scan the analog voltage. Vx is then given by Vx=Vramp(x).

The ADC includes a clock having a series of equal clock cycles; a ramp voltage generator for generating a ramp voltage level that rises linearly from V1 to V2 in N clock cycles, such that the ramp voltage level at an xth clock cycle is a digital level of the ramp voltage at a corresponding xth digital interval of the N equal digital intervals between V1 and V2; a comparator for comparing the voltage level of the ramp voltage with that of the analog voltage; a counter for counting a number of clock cycles (x') when the ramp voltage level has risen from V1 to match the analog voltage level; and wherein a digital value of the analog voltage level is produced as the corresponding x'th digital interval of the N equal digital intervals between V1 and V2.

The ramp voltage is provided by a constant current charging a capacitor and has a slope proportional to a DAC resistor, R(x) that is programmable from 1 to N. In a calibration mode, the R(x) is set to N, which results in K clock cycles spanning V1 to V2. In a subsequent normal mode, the DAC resistor is reset to R(K) to result in a calibrated ramp voltage that would rise from V1 to V2 in N clock cycles.

A method of operating such a non-volatile memory includes: providing an analog voltage level to be digitized into one of N equal digital intervals delimited between first and second predetermined voltage values (V1) and (V2) respectively; providing a clock having a series of equal clock cycles; providing a ramp voltage having a voltage level that rises linearly from V1 to V2 in N clock cycles, such that the ramp voltage level at an xth clock cycle is a digital level of the ramp voltage at a corresponding xth digital interval of the N equal digital intervals between V1 and V2; comparing the voltage level of the ramp voltage with that of the analog voltage; counting a number of clock cycles (x') when the ramp voltage level has risen from V1 to match the analog voltage level; and digitizing the analog voltage level to be at the corresponding x'th digital interval of the N equal digital intervals between V1 and V2.

The advantage of the present non-volatile memory is that its ADC has greater linearity, simpler hardware and area efficiency.

Various aspects, advantages, features and embodiments are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

Additional features and advantages will be understood from the following detailed description, which should be taken in conjunction with the accompanying drawings.

BRIEF DESCRIPTION OF THE DRAWINGS

FIG. 14 illustrates a highly linear ADC.

FIG. 15(A) is a graph showing the ramping voltage Vramp as a function of time generated by the programmable ramp generator.

FIG. 15(B) is a graph which together with FIG. 15 (A) shows the ramping voltage Vramp as a function of clock cycle.

FIG. 15(C) is an alternative axis for the graph of FIG. 15 (A) that shows the ramping voltage Vramp as a function of T (temperature).

DETAILED DESCRIPTION

Memory System

Figure 1:
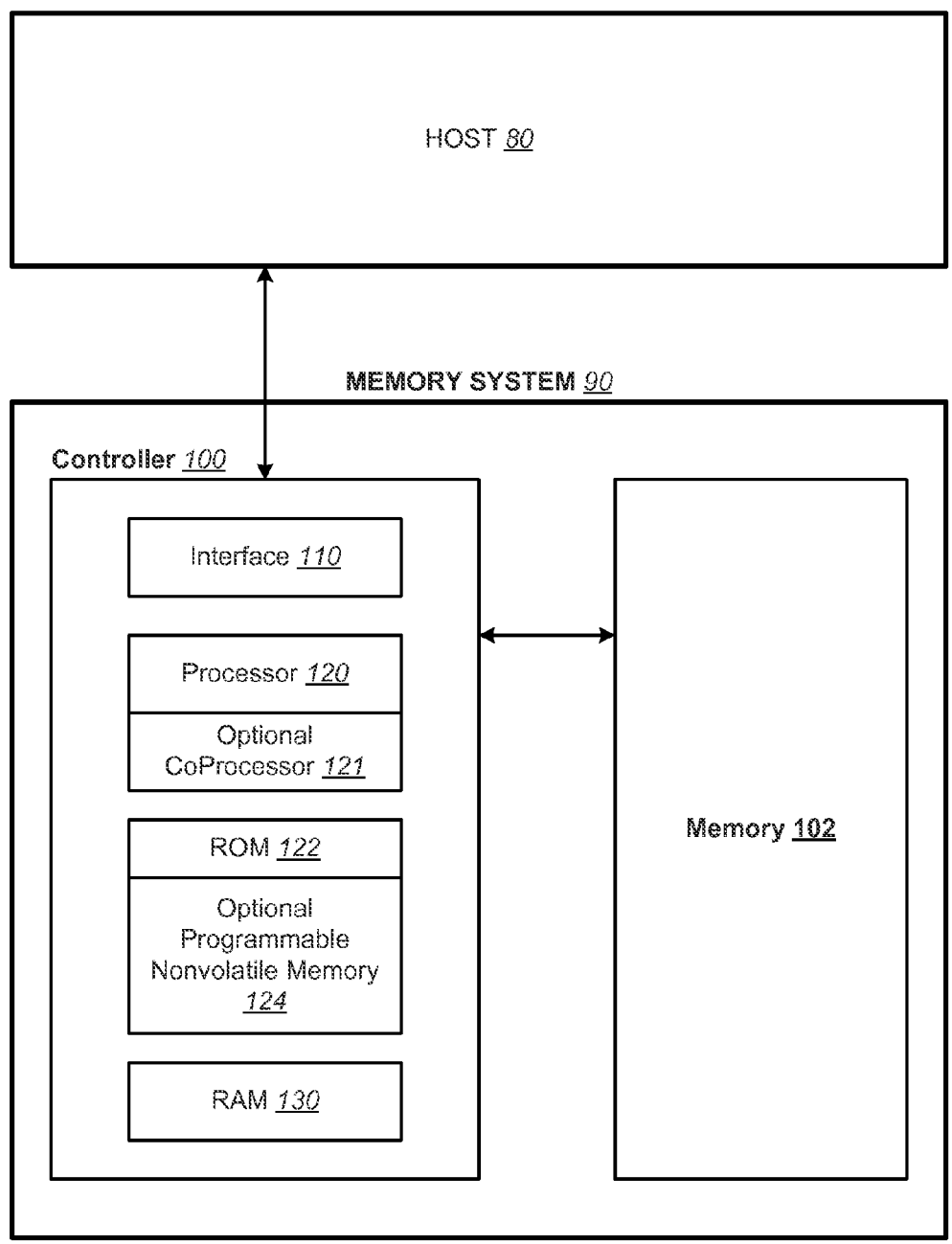
FIG. 1 illustrates schematically the main hardware components of a memory system suitable for implementing the present subject matter.

FIG. 1 illustrates schematically the main hardware components of a memory system suitable for implementing the present subject matter. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

With respect to the memory section 102, semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

Figure 2:
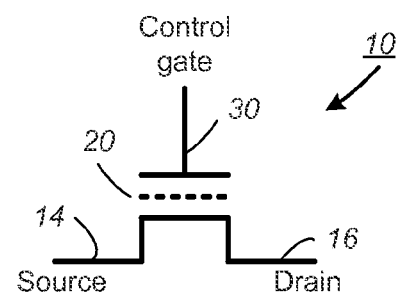
FIG. 2 illustrates schematically a non-volatile memory cell.

It will be recognized that the following is not limited to the two dimensional and three dimensional exemplary structures described but cover all relevant memory structures within the spirit and scope as described herein Physical Memory Structure FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Also, examples of memory devices utilizing dielectric storage elements.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
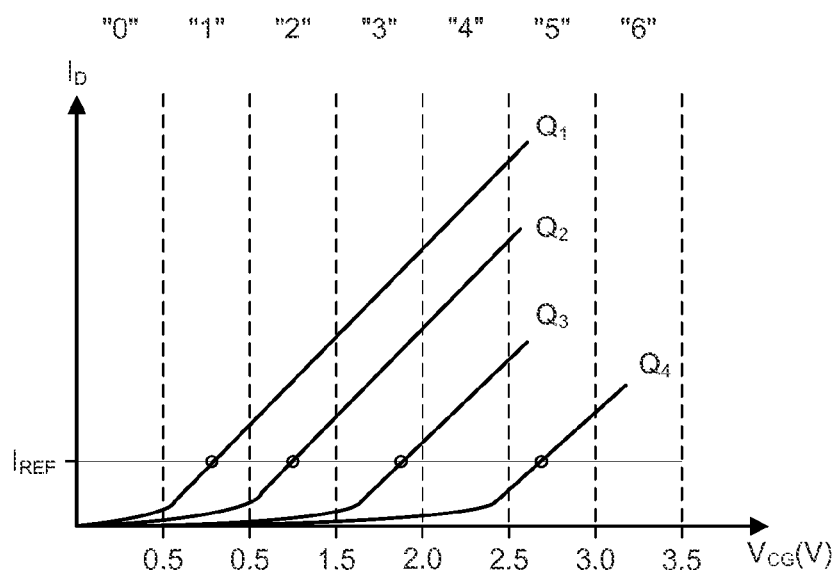
FIG. 3 illustrates the relation between the source-drain current $I_D$ and the control gate voltage $V_{CG}$.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 μA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
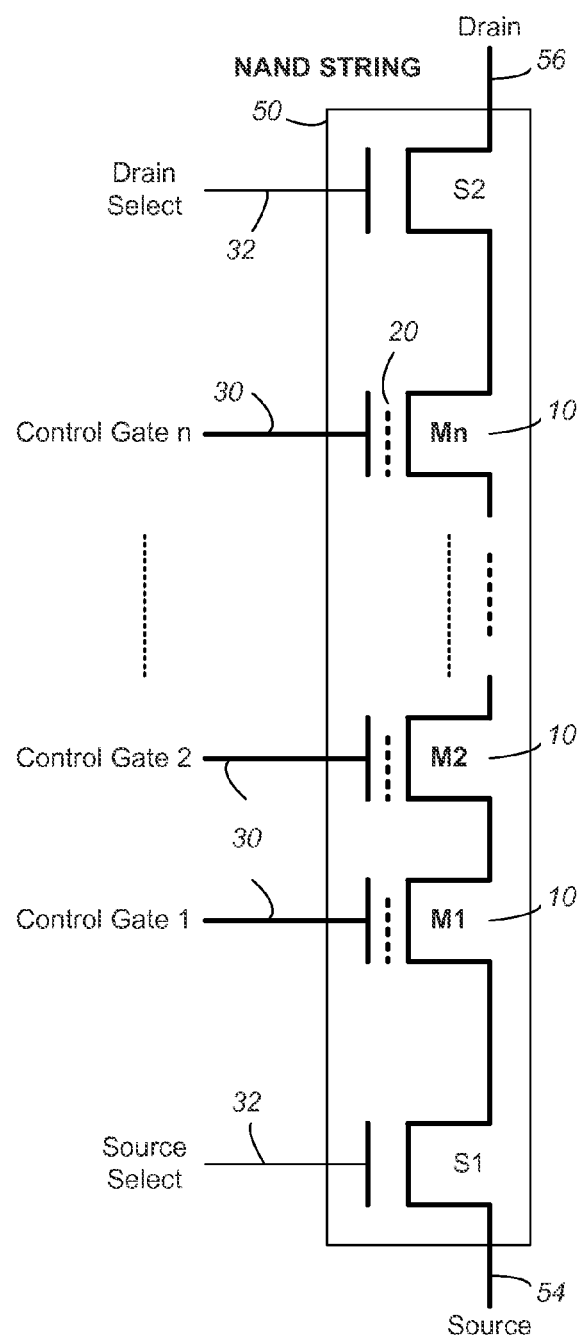
FIG. 4A illustrates schematically a string of memory cells organized into a NAND string.

FIG. 4A illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 5). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell.

Figure 4B:
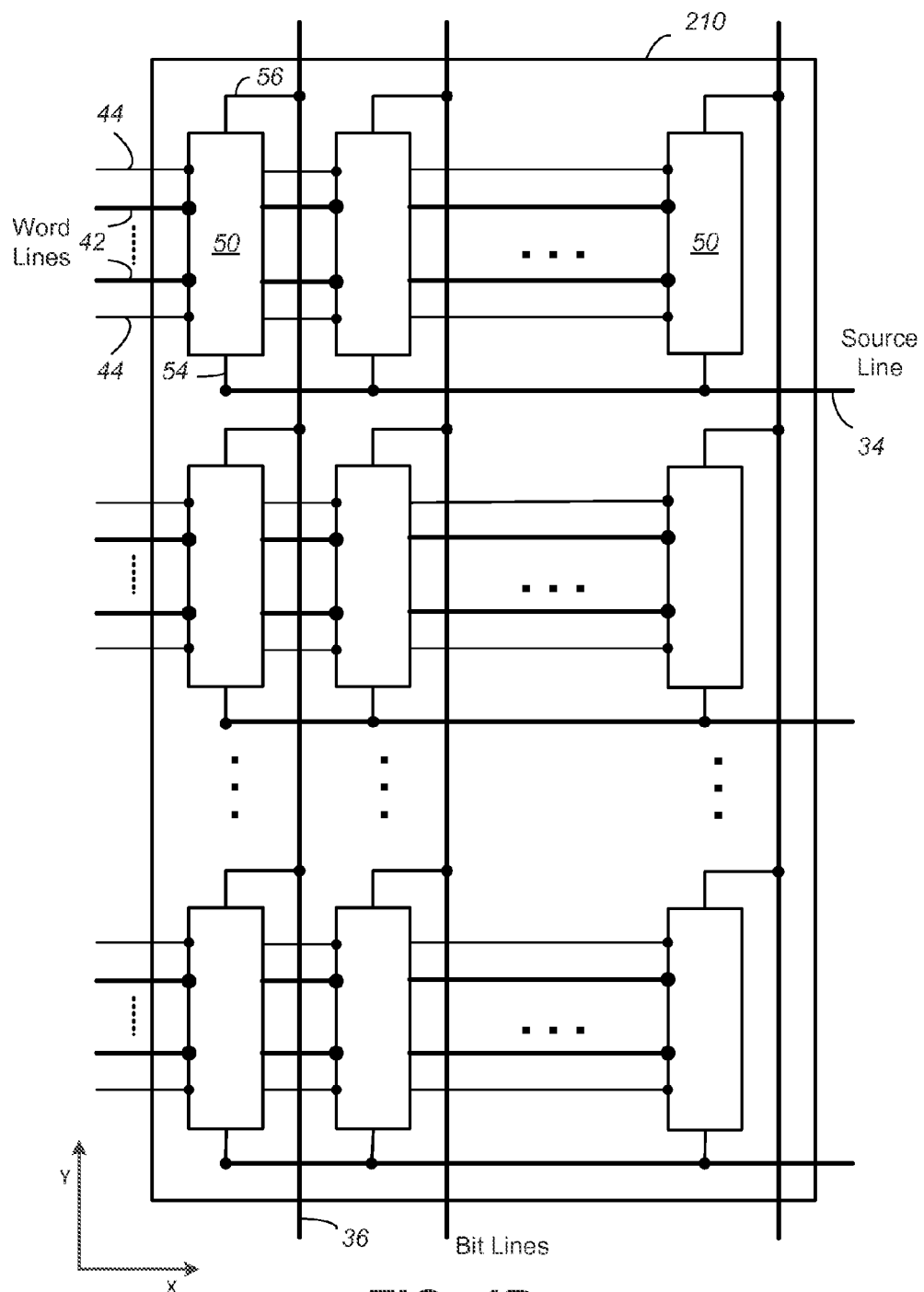
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
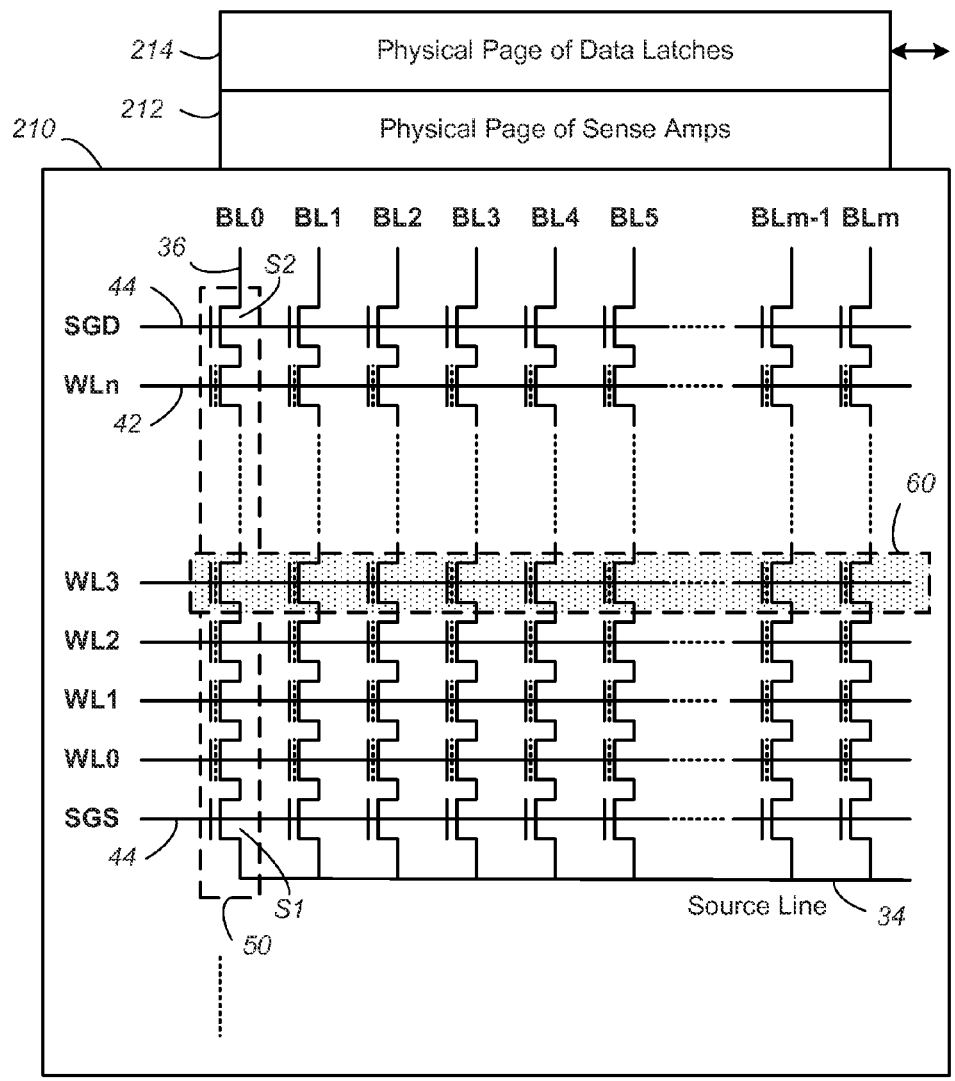
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines. A chip-level control circuitry 220 has a state machine 222 that controls the memory operations.

Figure 6:
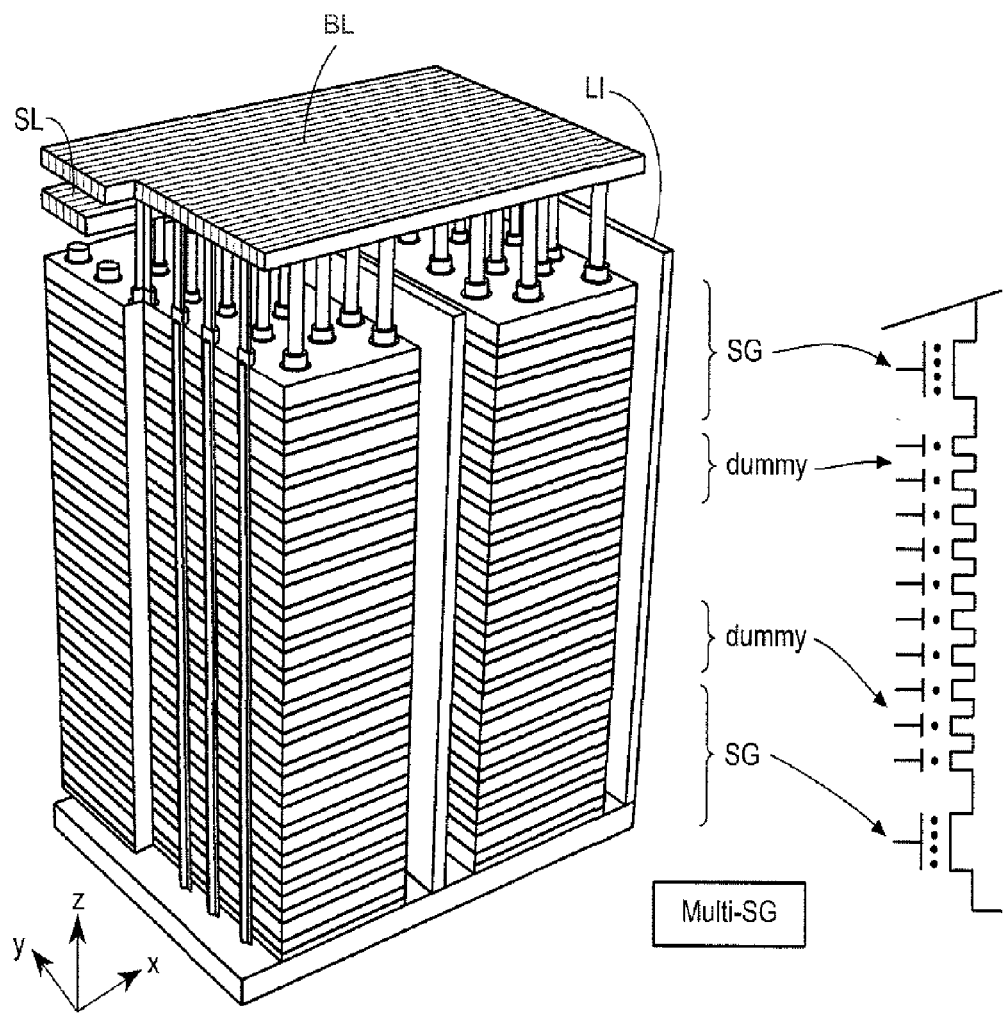
FIG. 6 illustrates an oblique projection of a part of a 3D NAND memory.

FIG. 6 illustrates an oblique projection of a part of a 3D NAND memory. An alternative arrangement to a two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

Physical Organization of the Memory

One difference between flash memory and other of types of memory is that a cell is programmed from the erased state. That is, the floating gate is first emptied of charge. Programming then adds a desired amount of charge back to the floating gate. It does not support removing a portion of the charge from the floating gate to go from a more programmed state to a lesser one. This means that updated data cannot overwrite existing data and is written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

Programming Operation

Figure 7:
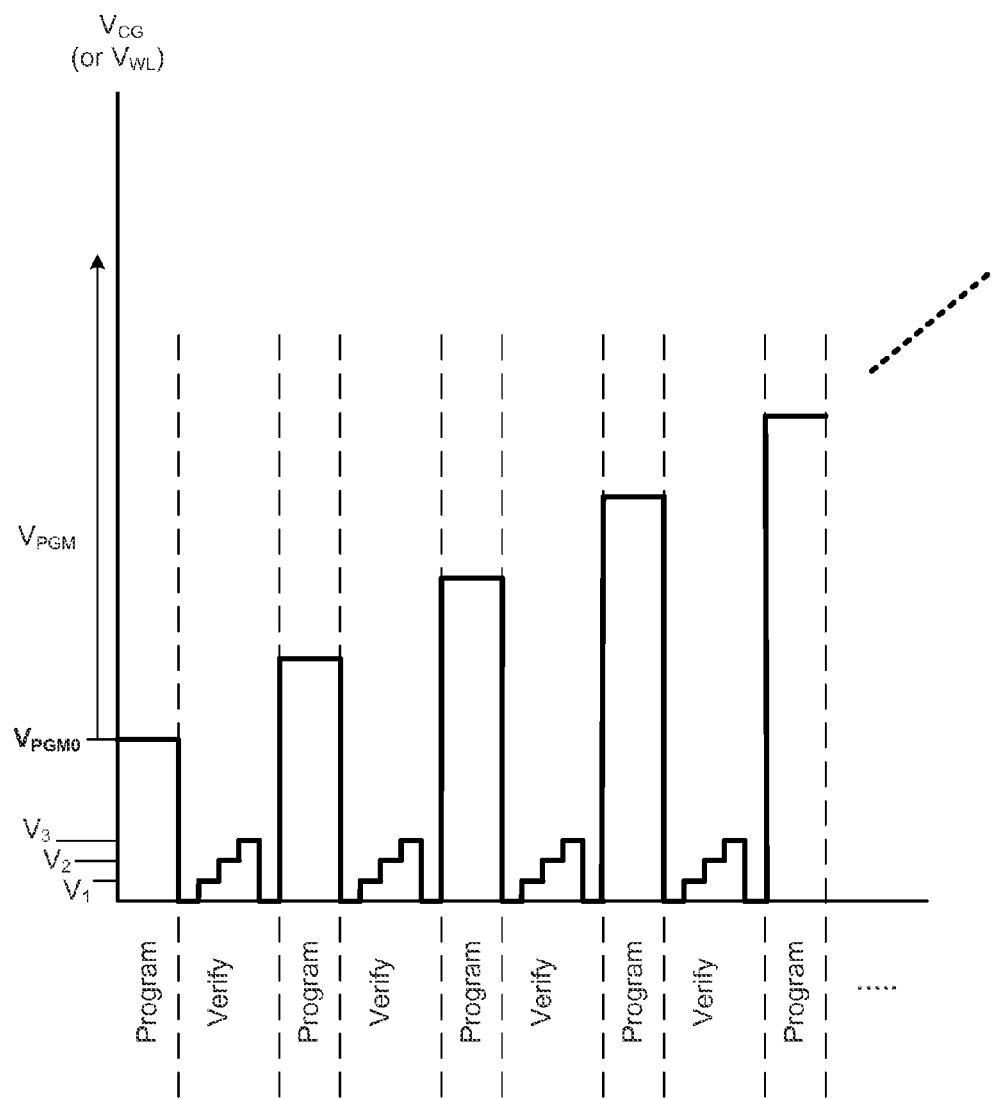
FIG. 7 illustrates a conventional technique for programming a 4-state memory cell to a target memory state.

FIG. 7 illustrates a conventional technique for programming a 4-state memory cell to a target memory state. Programming circuits generally apply a series of programming pulses to a selected word line. In this way, a page of memory cells whose control gates are coupled to the word line can be programmed together. The programming pulse train used may have increasing period or amplitude in order to counteract the accumulating electrons programmed into the charge storage unit of the memory cell. A programming voltage $V_{PGM}$ is applied to the word line of a page under programming. The programming voltage $V_{PGM}$ is a series of programming voltage pulses in the form of a staircase waveform starting from an initial voltage level, $V_{PGM0}$. Each cell of the page under programming is subject to this series of programming voltage pulses, with an attempt at each pulse to add incremental charges to the charge storage element of the cell. In between programming pulses, the cell is read back to determine its threshold voltage. The read back process may involve one or more sensing operation. For a 4-state memory, there will be three verify read points $V_1$, $V_2$ and $V_3$ to distinguish the four possible states. Programming stops for the cell when its threshold voltage has been verified to fall within the threshold voltage zone corresponding to the target state. Whenever a memory cell of the page has been programmed to its target state, it is program-inhibited while the other cells continue to be subject to programming until all cells of the page have been program-verified. One method of program-inhibiting a memory cell is to raise its bit line voltage from 0V to VCC during programming. In this way, even when the cell's control gate has a programming voltage on it, the effective programming voltage on the floating gate is reduced by VCC, thereby inhibiting further programming of the cell.

Voltage Generation for Memory Operations

In order to provide the voltages for memory operations such as the programming and verify operations shown in FIG. 7, as well as any read operations, a voltage generator capable of generating the various DC voltage levels on demand is required. Furthermore, the operations mostly depend on the thresholds of the FET and EEPROM devices making up the circuits and the memory cells. The thresholds of these FET and EEPROM devices changes with temperature. In order to maintain regularity in operation, a common type of these devices need to be supplied with an operating voltage that has a negative temperature coefficient. A voltage generator capable of programmable DC levels and temperature coefficients, yet compact and versatile, is desirable.

One example is an on-chip DC voltage generator. A temperature-dependent DC voltage is digitally derived from an on-chip temperature readout, a programmable digital word to control the temperature coefficient and a programmable digital word to adjust the digital level. The digital result is applied to the present improved digital to analog converter (DAC) to generate an analog DC voltage with a negative temperature slope. These voltages can be applied to the word line in the flash memory and track the threshold voltage of the memory cell, which has a negative temperature coefficient, such that the difference between the gate voltage and the threshold voltage is constant over temperature.

Figure 8:
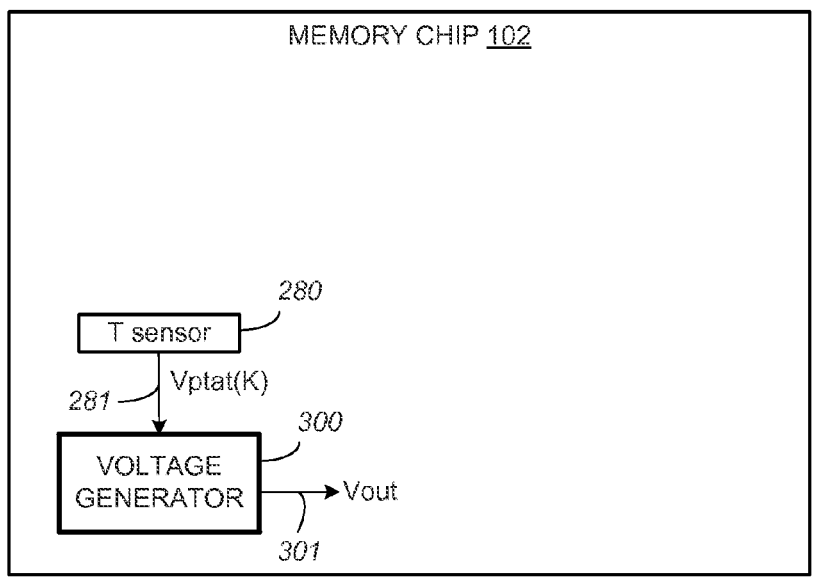
FIG. 8 illustrates an improved on-chip voltage generator.

FIG. 8 illustrates an improved on-chip voltage generator. The voltage generator 300 is fabricated on an integrated circuit chip 102 such as a nonvolatile memory device to supply DC voltages to operate the device. As will be described later, the voltage generator 300 is implemented by computing the required output voltage function in the digital domain before being converted to an analog output voltage, Vout. The digital manipulation allows the voltage generator to be implemented in a relative simple and compact manner, while being amenable to programmability.

The voltage generator 300 is programmable to supply, via an output 301, a voltage Vout selectable from a range of predefined discrete DC voltage levels. The Vout is generated with a temperature coefficient selectable from a range of predefined discrete temperature coefficients. The voltage generator 300 outputs Vout as a linear function of temperature where the slope or rate of change of the linear function is the temperature coefficient.

An on-chip temperature sensor 280 in the form of a PTAT generator provides a measure of the temperature of the chip and has an output 281 that outputs an analog voltage, Vptat (temperature-to-voltage). The temperature sensor 280 includes a bandgap reference generation circuit 282.

Figure 9A:
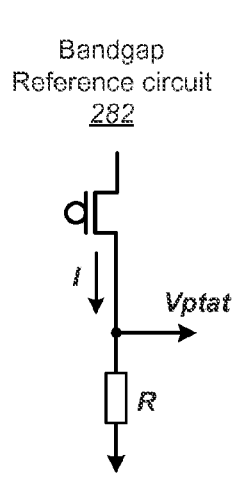
FIG. 9A illustrates the bandgap reference generation circuit that produces the analog Vptat as a predefined linear function of the sensed temperature T in degree Kelvin (K).

FIG. 9A illustrates the bandgap reference generation circuit that produces the analog Vptat as a predefined linear function of the sensed temperature T in degree Kelvin (K). The bandgap reference circuit generates a current I. When I is passed through a resistor R, it generates the PTAT voltage Vptat(T).

Figure 9B:
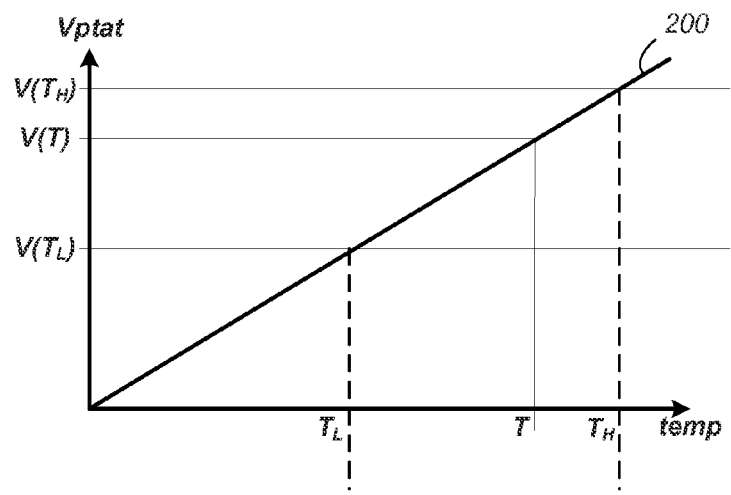
FIG. 9B illustrates a graph of the analog Vptat(T).

FIG. 9B illustrates a graph of the analog Vptat(T). To an approximately first order, the PTAT voltage, Vptat(T), is linear with temperature T. As temperature goes higher, so does Vptat(T).

The voltage generator 300 puts out Vout over a predefined operating range of temperatures from $T_L$ to $T_H$. In practice, the temperature range is the operating temperature range in which the chip is expected to function. For example, for a memory chip, $T_L$=−40 C and $T_H$=85 C. The corresponding PTAT voltage will be Vptat($T_L$) and Vptat($T_H$) respectively.

Figure 10:
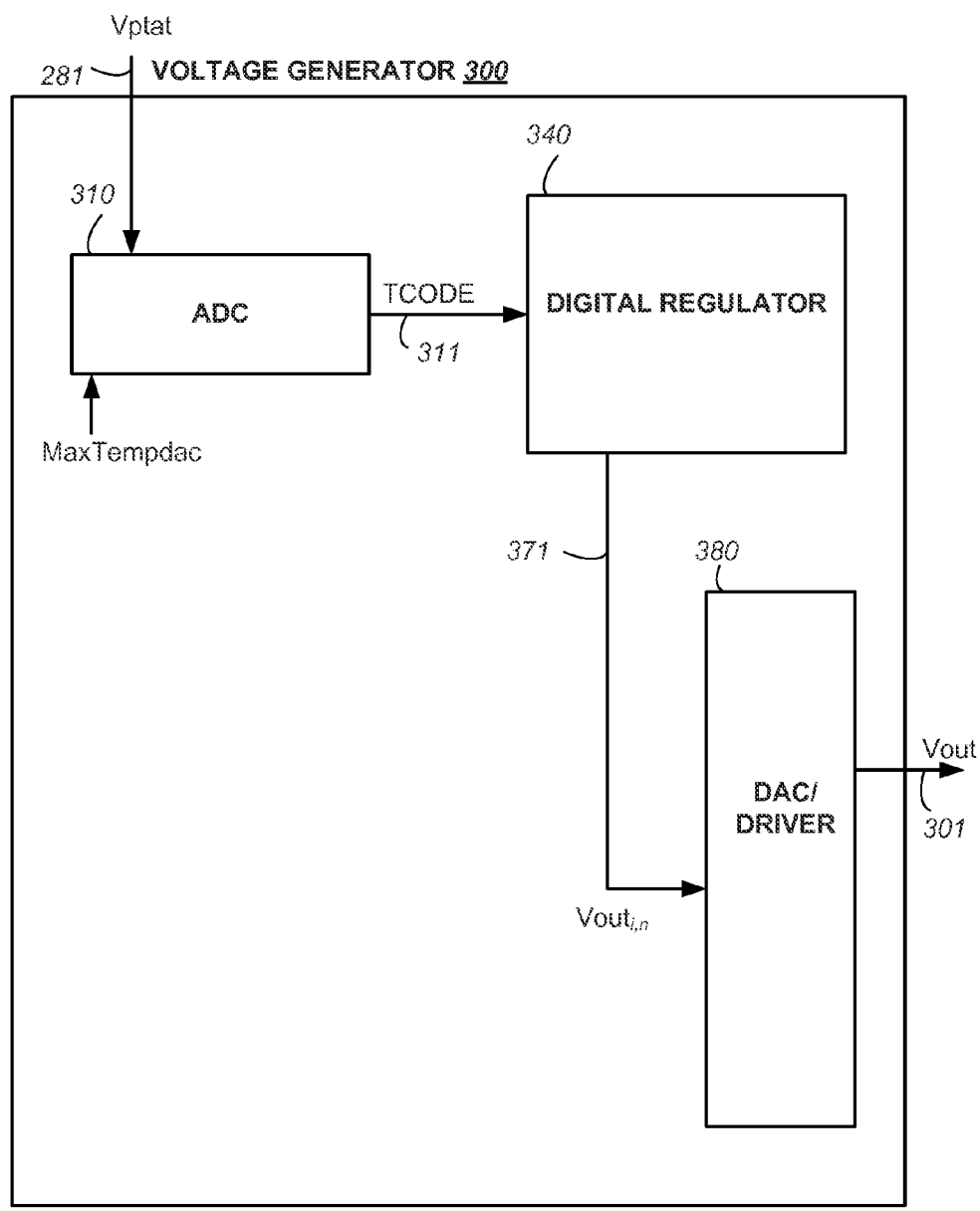
FIG. 10 illustrates in more details the voltage generator shown in FIG. 8.

FIG. 10 illustrates in more details the voltage generator shown in FIG. 8. The voltage generator 300 includes an analog-to-digital converter (ADC) 310, a digital regulator 340 and a digital-to-analog converter (DAC)/driver 380. It can be seen the voltage generator 300 is compact and easy to execute with most of the complexity handled simply in the digital domain. Essentially, the analog temperatures sensed by the sensor 280 shown in FIG. 8 is digitized by the ADC 310 into quanta of temperature steps and each quantum or step is coded with a binary code, Tcode. The digital regulator 340 computes the desired voltage function in the digital domain. Finally, the computed result is converted back to an analog Vout by the DAC/driver 380.

The ADC 310 has an input 281 for receiving Vptat(T), which is an analog voltage proportional to absolute temperature output by the PTAT generator temperature sensor 280 shown in FIG. 8. The ADC 310 is used to convert the analog voltage Vptat(T) output from the temperature sensor into a digital temperature code word Tcode between $T_L$ and $T_H$.

In conventional design, the ADC is a standard flash ADC comprised of a bank of comparators that compare equally spaced reference voltages tapped from a reference resistor string, with a voltage that is proportional to absolute temperature (PTAT). The conventional ADC compares Vptat(T) to the various tap points on the reference resistor string and outputs a thermometer style digital code which in turn is converted into a binary code using a thermometer to binary encoder. The binary output is a digital representation of the temperature. Thus, the operating range of temperature between $T_L$ and $T_H$ is quantized and each quantum step is represented by a Tcode. The digitalized sensed temperature value will be represented by a Tcode word output at an output 311.

The digital regulator 340 computes the output voltage of the voltage generator in the digital domain. It receives the Tcode via a line 311 from the ADC and performs voltage regulation to output a computed code word, Vout$_{i,n}$. The DAC/driver 380 converts the computed code word Vout$_{i,n}$ to a corresponding analog Vout to appear at an output 301.

U.S. Pat. No. 8,334,796 discloses an on-chip DC voltage generator for generating linear DC voltages with a programmable negative temperature coefficient. The entire disclosure of U.S. Pat. No. 8,334,796 is incorporated herein by reference. The ADC used is a standard flash ADC.

Figure 11:
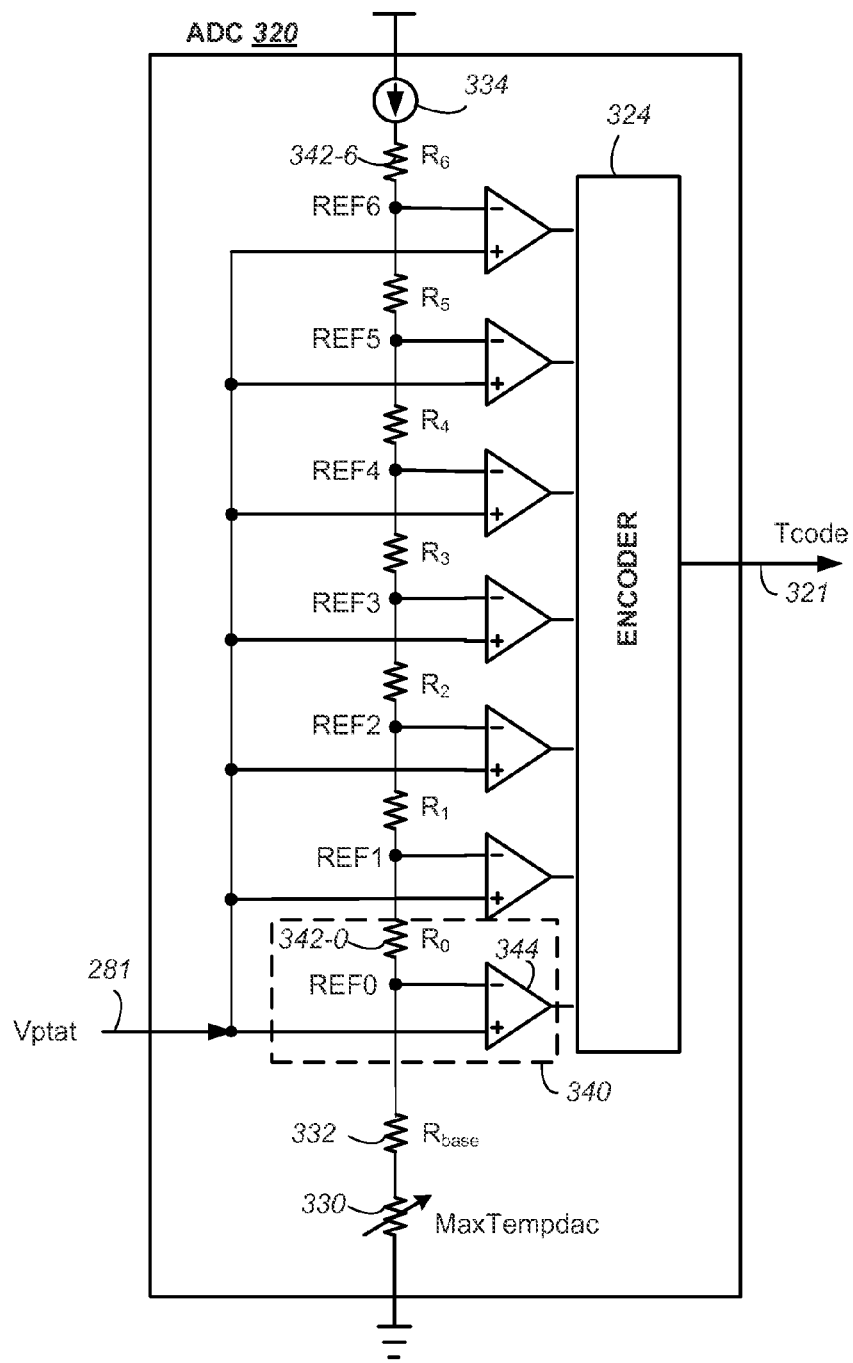
FIG. 11 illustrates in more detail a conventional ADC (analog-to-digital converter) shown in FIG. 10.

FIG. 11 illustrates in more detail a conventional ADC (analog-to-digital converter) shown in FIG. 10. A 3-bit example of the ADC 310 is illustrated for simplicity although in general the ADC is L-bit, where $2^L=N$, the number of digital intervals. Generalization to other number of bits is trivial. Basically, between ground and a temperature-independent current source 334 is a reference resistor string formed by Rbase 332, R0, R1, R2, . . . , R6, with equally spaced voltage taps, Ref0, Ref1, Ref2, Ref6. Rbase 332 is set so that the voltage at Ref0 is at Vptat(T1) and Ref6 is at Vptat(T2). In this way, the reference resistor string acts as a voltage divider which essentially divide the temperature range T1 to T2 into 7 gradations.

The bank of comparators along with the reference resistor string forms a flash ADC. The analog input Vptat from the temperature sensor is received via line 281 and is compared at each level of the resistor string respectively with the voltages at Ref0 to Ref6. For example, at the lowest level, the flash ADC has a module 340 that includes a comparator 344 to compare Vptat with the voltage at Ref0. As Vptat increases, each of the comparators flips, giving a thermometer code.

Figure 12:
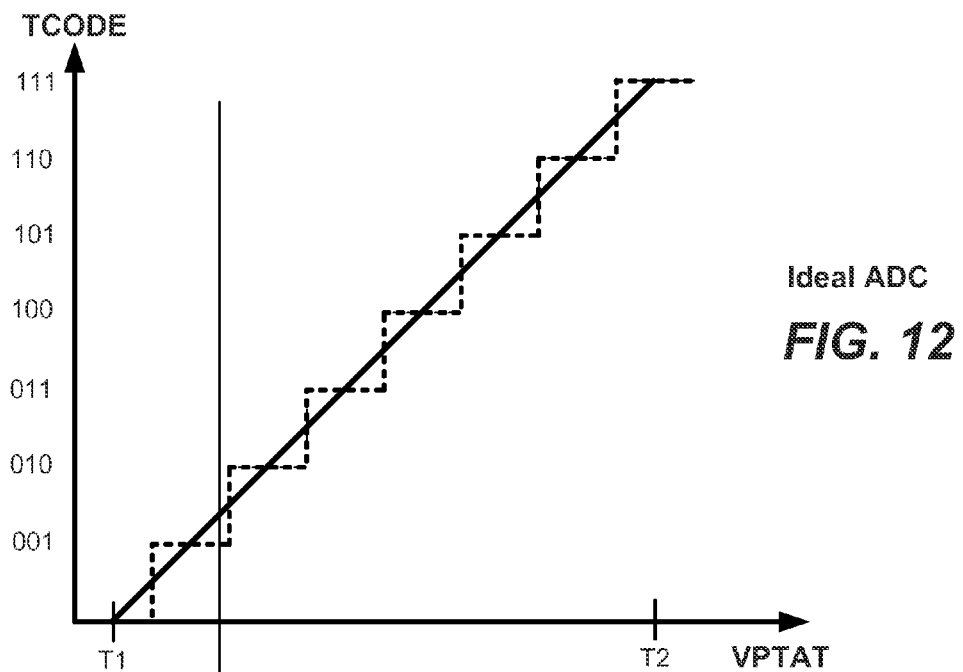
FIG. 12 illustrates an idealized temperature code, Tcode, output from the encoder of the ADC shown in FIG. 8.

FIG. 12 illustrates an idealized temperature code, Tcode, output from the encoder of the ADC shown in FIG. 8. The comparator results from the ADC module 340 of all the levels are input to an encoder 324 which outputs the 3-bit Tcode, which is the digital temperature between T1 and T2 corresponding to the detected Vptat. The range of the ADC 310 is limited by the lowest and highest reference taps Ref0 and Ref6. Once Vptat goes above Ref6, the highest comparator in the ADC will have flipped and therefore, the output of the ADC saturates as its maximum output code. For example, the quantized temperature range extends from $T_L=-40$ degree C. to $T_H=85$ degree C. This range is quantized by a 5-bit flash ADC using 31 comparators.

However, in practice the flash ADC shown in FIG. 10 is non-linear due to non-uniformity of the individual comparators in the ADC.

Figure 13:
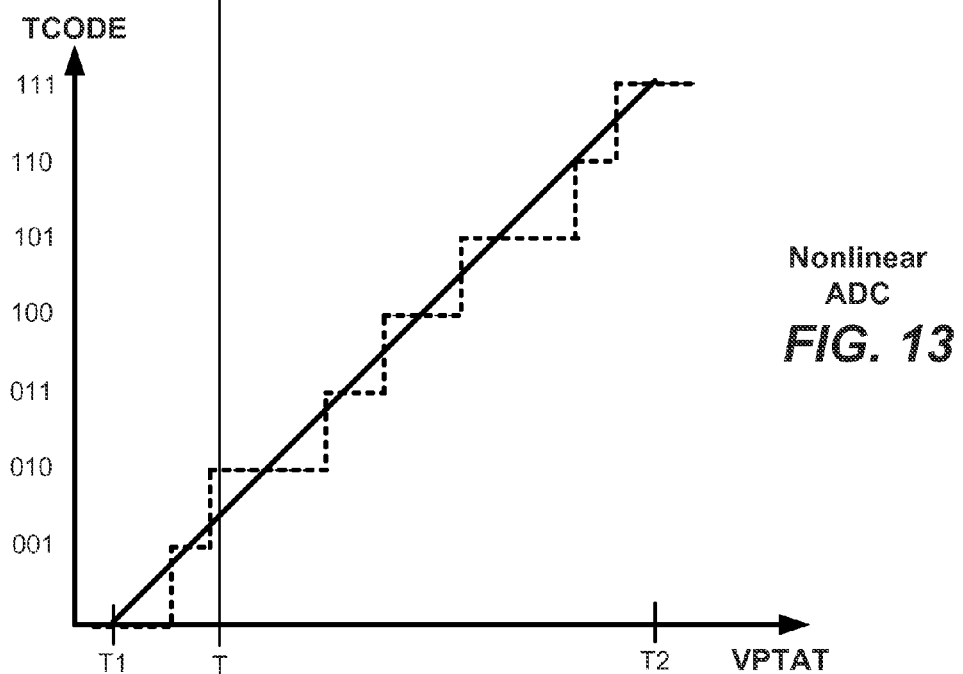
FIG. 13 illustrates a temperature code, Tcode, output from the encoder of a non-linear ADC.

FIG. 13 illustrates a temperature code, Tcode, output from the encoder of a non-linear ADC. The non-linearity is a source of error. This can be illustrated by a comparison between the same VPTAT value for the ideal ADC shown in FIG. 12 and the non-linear ADC shown in FIG. 13. For a value T, the ideal ADC outputs a Tcode as "001", but the non-linear ADC outputs the Tcode as "010"

Highly Linear ADC

Instead of using a conventional bank of comparators with a string of reference resistors, a linear ramp voltage is use to scan the analog voltage, clock-cycle by clock-cycle. The linear ramp voltage rises from a first voltage limit to a second voltage limit in N clock cycles. The digital value of the analog voltage is obtained by noting the clock cycle in which the ramp voltage equals the analog voltage.

FIG. 14 illustrates a highly linear ADC. The Analog-to-Digital converter, ADC 310 digitizes the input analog Vptat(T) between two limits $V_L$ and $V_H$ into one of N intervals and then encodes the digitized Vptat(T) into a digital Tcode(T). The ADC 310 includes a programmable ramp generator 330, a ramp counter 360 and an encoder 370, which are under the control of a control module 380.

FIG. 15(A) is a graph showing the ramping voltage Vramp as a function of time generated by the programmable ramp generator. The ramping voltage Vramp is at $V_L$ at $t_L$ and increases linearly to $V_L$ at $t_H$. N clock cycles.

FIG. 15(B) is a graph which together with FIG. 15 (A) shows the ramping voltage Vramp as a function of time clock cycle. The ramping voltage Vramp is at $V_L$ at count 0 of the clock cycle and increases linearly to $V_H$ at count N.

FIG. 15(C) is an alternative axis for the graph of FIG. 15 (A) that shows the ramping voltage Vramp as a function of T (temperature). The ramping voltage Vramp is at $V_L$ at $T_L$ and increases linearly to $V_H$ at $T_H$.

The ramping voltage, Vramp, is used by the ramp counter 350 to scan the voltage Vptat(T) at a given T shown in FIG. 9B. If the ramp counter 350 counts to the xth clock cycle when Vramp reaches the same amplitude as Vptat(T), then by proportion, the corresponding temperature is given by Tx=(x/N)($T_H-T_L$)

The encoder 370 is then used to encode Tx to Tcode, which is a multi-bit code word.

Figure 16:
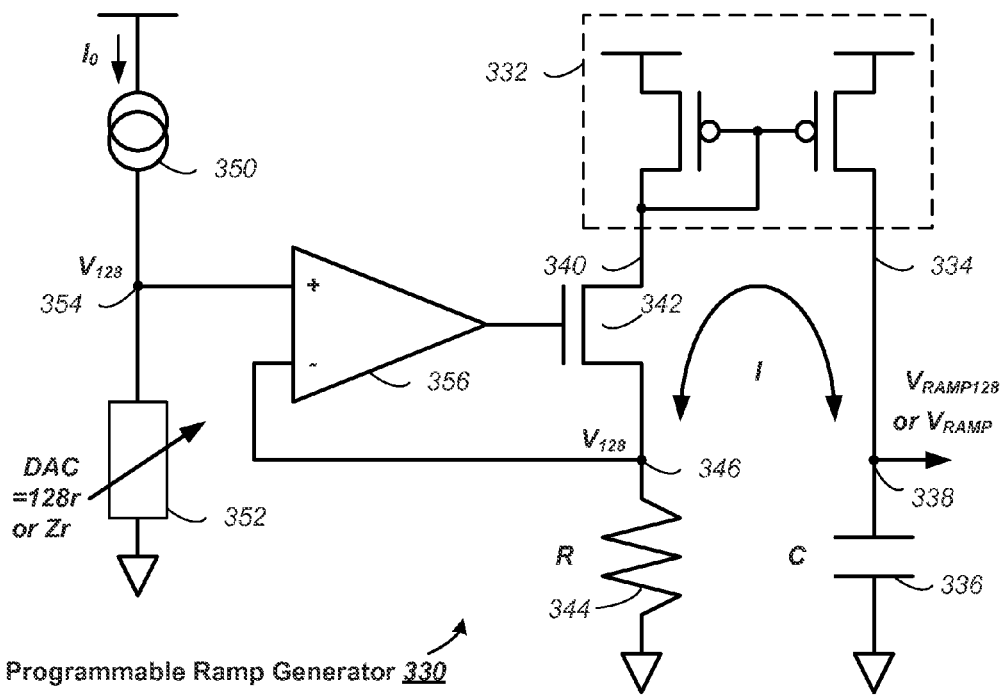
FIG. 16 illustrates an example of the programmable ramp generator in more detail.

FIG. 16 illustrates an example of the programmable ramp generator in more detail. The programmable ramp generator 330 generates a linear voltage by using a constant current to charge a capacitor. The constant current is programmable by a resistor DAC circuit. The programmable ramp generator 330 includes a current mirror 332 having I in a first current branch 340 mirrored into a second current branch 334.

The current I in the second current branch 334 is where the constant current I discharges a capacitor 336 and the charging voltage Vramp is output from an output node 338 connected to the capacitor 336. Thus, $$\Delta V\text{ramp} = (I\Delta t)/C \qquad \text{Equation 1}$$

The current I in the first current branch 340 is controlled a transistor 342 in series with a resistor 344 to ground. A node 346 between the transistor 342 and the resistor 342 has a voltage $$V1 = IR \qquad \text{Equation 2}$$

This voltage V1 will be controlled by a programmable reference voltage circuit. The programmable reference voltage circuit has a constant current source 350 feeding a current $I_0$ to a programmable resistive DAC 352 having a programmable resistance $R_{DAC}$. A node 354 between the DAC 352 and the constant current source 350 has a voltage $$V_{DAC}(y) = I_0 R_{DAC}(y) = I_0 y r \qquad \text{Equation 3}$$

where y=1, 2, 3, . . . and r is an unit resistance of the DAC

An op amp 356 compares V1 with $V_{DAC}(y)$ and drives the transistor 342 accordingly to equalize the two voltages, so that $$V_{DAC}(y)=V1 \quad \text{Equation 4}$$

Combining Equations 1, 2, 3 and 4:

$$I_0 yr = IR = C\Delta Vramp/\Delta t$$

$$I_0 yr = C\Delta Vramp/x\tau \quad \text{Equation 5}$$

where $\tau$ is a clock period.

Calibration of the Programmable Ramp Generator

Suppose N=128 and the DAC's programmable resistance is given by y=1 to 128. In an uncalibrated state, the programmable ramp generator will output an uncalibrated Vramp1 that will not necessarily fit exactly N=128 clock cycles between $V_L$ and $V_H$.

In a calibration mode of the programmable ramp generator 330, the DAC is programmed to DAC(128) which provides a resistance of 128r. This produces a ramp voltage, Vramp1, that takes K clock cycles to ramp from $V_L$ to $V_H$. Thus $$I_0 128r = C\Delta Vramp1/K\tau \quad \text{Equation 5}$$

In a normal mode of the programmable ramp generator 330, it is desired to have a calibrated ramp voltage, Vramp, that takes N=128 clock cycles to ramp from $V_L$ to $V_H$. Since Equation 4 is symmetric in terms of interchanging between the two clock cycle counts, during normal operation, the DAC can be reset to DAC(K) with a resistance of Kr. This would mean the following equation is equally valid:

$$I_0 Kr = C\Delta Vramp/128\tau \quad \text{Equation 6}$$

And the calibrated Vramp will take N=128 clock cycles to ramp from $V_L$ to $V_H$ as desired. This Vramp can then be used to scan and digitalize Vptat.

Figure 17:
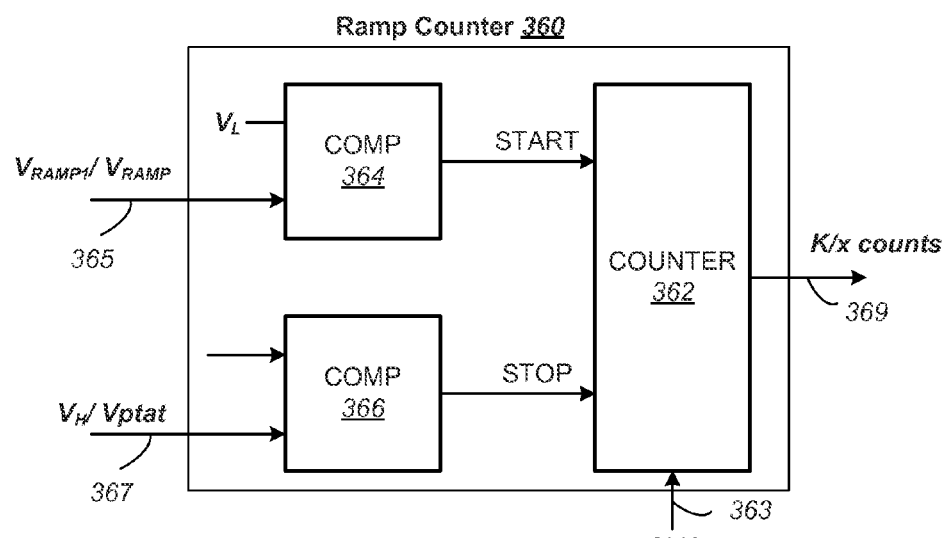
FIG. 17 illustrates in more detail the ramp counter shown in FIG. 14.

FIG. 17 illustrates in more detail the ramp counter shown in FIG. 14. The ramp counter 360 includes a counter 362 for counting a number of clock cycles from a clock signal CLK through an input 363. The counter 362 responds to a START signal to begin the counting and to a STOP signal to end counting. The START and STOP signals are from the outputs of two comparators 364 and 366 respectively. The comparator 364 compares an incoming voltage Vramp1 or Vramp from an input line 365 with the reference voltage $V_L$ and asserts the START signal when there is a match. The comparator 366 compares a first input voltage on a line 365 with a second input voltage on a line 367.

During the calibration mode, the comparator 364 is comparing Vramp1 with $V_L$ and asserts the START signal to start the counter 362 counting when there is a match. The comparator 366 is comparing Vramp1 with $V_H$ and asserts the STOP signal to stop the counter 362 when there is a match. At that point, count K is output and used to reset the DAC in the programmable ramp generator 330.

During the normal mode, the comparator 364 is comparing Vramp with $V_L$ and asserts the START signal to start the counter 362 counting when there is a match. The comparator 366 is comparing Vramp with Vptat and asserts the STOP signal to stop the counting when there is a match. At that point, count x is output. This means that in the range spanned by VL to VH that has been divided into N=128 intervals, Vptat is determined to be at the xth interval. This will yield the digitized Vramp.

The operations of the calibration mode and the normal mode of the programmable ramp generator 330 and the ramp counter 360 are controlled by the control module 380 (see FIG. 14.)

Figure 18:
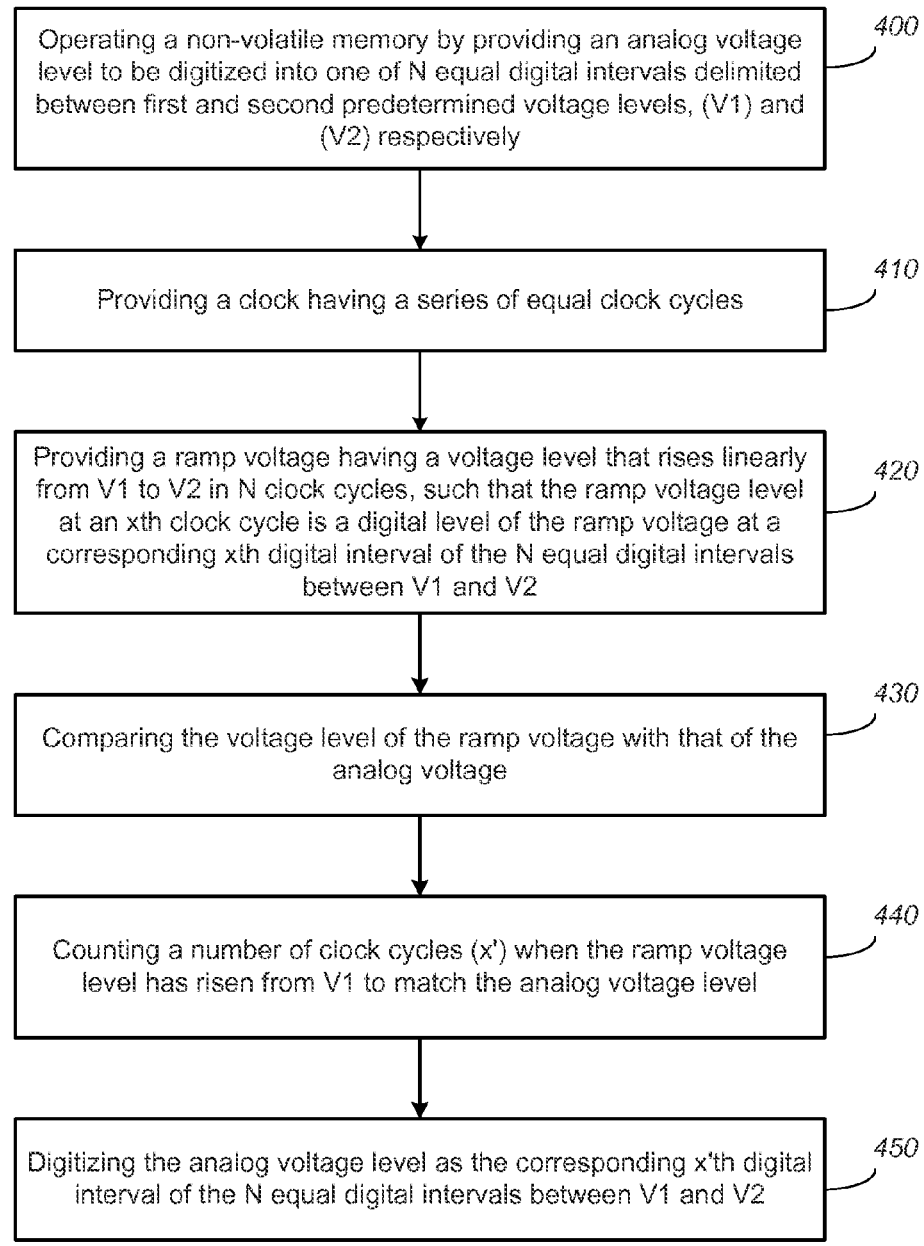
FIG. 18 is a flow diagram illustrating a method of operating a non-volatile memory in which an analog voltage is digitized.

FIG. 18 is a flow diagram illustrating a method of operating a non-volatile memory in which an analog voltage is digitized.

STEP 400: Operating a non-volatile memory by providing an analog voltage level to be digitized into one of N equal digital intervals delimited between first and second predetermined voltage levels, (V1) and (V2) respectively. Proceed to STEP 410.

STEP 410: Providing a clock having a series of equal clock cycles. Proceed to STEP 420.

STEP 420: Providing a ramp voltage having a voltage level that rises linearly from V1 to V2 in N clock cycles, such that the ramp voltage level at an xth clock cycle is a digital level of the ramp voltage at a corresponding xth digital interval of the N equal digital intervals between V1 and V2. Proceed to STEP 430.

STEP 430: Comparing the voltage level of the ramp voltage with that of the analog voltage. Proceed to STEP 440.

STEP 440: Counting a number of clock cycles (x') when the ramp voltage level has risen from V1 to match the analog voltage level. Proceed to STEP 450.

STEP 450: Digitizing the analog voltage level as the corresponding x'th digital interval of the N equal digital intervals between V1 and V2.

CONCLUSION

The foregoing detailed description has been presented for purposes of illustration and description. It is not intended to be exhaustive or to limit the above to the precise form disclosed. Many modifications and variations are possible in light of the above teaching. The described embodiments were chosen in order to explain the principles involved and its practical application, to thereby enable others to best utilize the various embodiments and with various modifications as are suited to the particular use contemplated. It is intended that the scope be defined by the claims appended hereto.

It is claimed:

1. A nonvolatile memory comprising:
    an analog-to-digital converter (ADC) for digitizing an analog voltage into one of N equal digital intervals delimited between first and second predetermined voltage values (V1) and (V2) respectively, the ADC comprising;
    a clock having a series of equal clock cycles;
    a ramp voltage generator for generating a ramp voltage level that rises linearly from V1 to V2 in N clock cycles, such that the ramp voltage level at an xth clock cycle is a digital level of the ramp voltage at a corresponding xth digital interval of N equal digital intervals between V1 and V2;
    a comparator for comparing the ramp voltage level with that of a level of the analog voltage; and
    a counter for counting a number of clock cycles (x') when the ramp voltage level has risen from V1 to match the level of the analog voltage;
    wherein a digital value of the level of the analog voltage is produced as a corresponding x'th digital interval of the N equal digital intervals between V1 and V2.

2. The nonvolatile memory as in claim 1, wherein said ramp voltage generator comprises:
    a capacitor;
    a programmable constant current source; and
    a linear ramp voltage produced by said programmable constant current source charging said capacitor.

3. The nonvolatile memory as in claim 2, wherein:
    said ramp voltage generator further comprises a programmable digital-to-analog converter (DAC) resistor; and the programmable constant current source is proportional to a resistance of said programmable DAC resistor.

4. The nonvolatile memory as in claim 3, wherein:
said ramp voltage generator has a ramp rate proportional to the programmable DAC resistor of resistance R(x) within a range between R(1) to R(N).

5. The nonvolatile memory as in claim 4, further comprising:
a control module for controlling operations of said ramp voltage generator and said counter, the operations including:
setting the programmable DAC resistor to R(N) for the ramp voltage generator to generate an uncalibrated ramp voltage;
counting a number of clock cycles (K) for the uncalibrated ramp voltage to rise from V1 to V2; and
resetting the programmable DAC resistor in proportion to K for the ramp voltage generator to generate a calibrated ramp voltage with a voltage level that rises from V1 to V2 in said N clock cycles.

6. The nonvolatile memory as in claim 1, wherein:
said ADC is part of the nonvolatile memory for digitizing a temperature dependent voltage from a temperature sensor into a digital temperature code; and
the digital temperature code is used by a voltage generator of the nonvolatile memory to compensate for temperature.

7. The nonvolatile memory as in claim 1, wherein:
the non-volatile memory includes a plurality of memory cells; and
said ADC is for digitizing a voltage associated with sensing of the plurality of memory cells.

8. The nonvolatile memory as in claim 7, wherein:
said plurality of memory cells are organized in a two-dimensional array.

9. The nonvolatile memory as in claim 7, wherein:
said plurality of memory cells are organized in a three-dimensional array.

10. The nonvolatile memory as in claim 7, wherein:
said plurality of memory cells are arranged in a NAND type architecture.

11. A nonvolatile memory comprising:
a clock having a series of equal clock cycles;
a ramp voltage generator for generating a ramp voltage level that rises linearly from a first predetermined voltage value (V1) to a second predetermined voltage value (V2) in N clock cycles, such that the ramp voltage level at an xth clock cycle is a digital level of the ramp voltage at a corresponding xth digital interval of N equal digital intervals between V1 and V2;
a comparator for comparing the ramp voltage level with that of a level of an analog voltage; and
a counter for counting a number of clock cycles (x') when the ramp voltage level has risen from V1 to match the level of the analog voltage;
wherein a digital value of the level of the analog voltage is produced as a corresponding x'th digital interval of the N equal digital intervals between V1 and V2.

12. A method of operating a nonvolatile memory, comprising:
providing an analog voltage to be digitized into one of N equal digital intervals delimited between first and second predetermined voltage values (V1) and (V2) respectively;
providing a clock having a series of equal clock cycles;
providing a ramp voltage having a ramp voltage level that rises linearly from V1 to V2 in N clock cycles, such that the ramp voltage level at an xth clock cycle is a digital level of the ramp voltage at a corresponding xth digital interval of the N equal digital intervals between V1 and V2;
comparing the ramp voltage level with that of a level of the analog voltage;
counting a number of clock cycles (x') when the ramp voltage level has risen from V1 to match the level of the analog voltage; and
digitizing the level of the analog voltage to be at the corresponding x'th digital interval of the N equal digital intervals between V1 and V2.

13. The method as in claim 12, wherein said providing the ramp voltage further comprises:
charging a capacitor by a programmable constant current to provide the ramp voltage.

14. The method as in claim 13, further comprising:
providing a programmable digital-to-analog converter (DAC) resistor; and
setting a resistance of the programmable DAC resistor proportionally to program the programmable constant current.

15. The method as in claim 14, wherein said ramp voltage has a ramp rate proportional to the programmable DAC resistor of resistance R(x) within a range between R(1) to R(N).

16. The method as in claim 15, further comprising:
setting the programmable DAC resistor to R(N) to generate an uncalibrated ramp voltage;
counting a number of clock cycles (K) for the uncalibrated ramp voltage to rise from V1 to V2; and
resetting the programmable DAC resistor in proportion to K to generate a calibrated ramp voltage with a voltage level that rises from V1 to V2 in said N clock cycles.

17. The method as in claim 12, wherein:
said analog voltage is a temperature dependent voltage from a temperature sensor in the nonvolatile memory; and
wherein the digitized level of the analog voltage is used by a voltage generator of the nonvolatile memory to compensate for temperature.

\* \* \* \* \*